United States Patent [19]

Platzer et al.

[11] Patent Number: 4,910,120

[45] Date of Patent: Mar. 20, 1990

[54] PREPARATION OF RECEIVER SHEET MATERIALS FOR PEEL DEVELOPABLE, SINGLE SHEET COLOR PROOFING SYSTEM

[75] Inventors: Stephan J. W. Platzer, Califon; Timothy T. Hannigan, Basking Ridge, both of N.J.

[73] Assignee: Hoechst Celanese Corporation, Somerville, N.J.

[21] Appl. No.: 261,381

[22] Filed: Oct. 21, 1988

[51] Int. Cl.$^4$ .......................... G03C 11/12; G03C 5/16
[52] U.S. Cl. .................................... 430/253; 430/252; 430/254; 430/271
[58] Field of Search ................ 430/253, 254, 252, 271

[56] References Cited

U.S. PATENT DOCUMENTS

| | | | |
|---|---|---|---|
| 3,573,918 | 4/1971 | Chambers et al. | 96/87 |
| 3,649,268 | 3/1972 | Chu et al. | 96/27 |
| 3,770,438 | 1/1973 | Celeste | 430/253 |
| 4,232,308 | 8/1981 | Cohen et al. | 430/271 |
| 4,316,951 | 2/1982 | Cohen et al. | 430/253 |

Primary Examiner—Paul R. Michl
Assistant Examiner—Cynthia Hamilton
Attorney, Agent, or Firm—Plottel & Roberts

[57] ABSTRACT

This invention relates to positive-working, photopolymerizable containing sheet constructions which, upon exposure to an actinic radiation source through a screened image, can accurately reproduce said image on conventional paper with an adhesive layer pretreatment. The construction is useful as a peel apart color proofing film which can be employed to accurately predict the image quality from a lithographic printing process.

20 Claims, No Drawings

PREPARATION OF RECEIVER SHEET MATERIALS FOR PEEL DEVELOPABLE, SINGLE SHEET COLOR PROOFING SYSTEM

BACKGROUND OF THE INVENTION

In the art of lithography, it is desirable to produce a multicolor proof to assist a printer in correcting a set of color separations which will be used in exposing a series of expensive lithographic printing plates. The proof should reproduce the color quality that will be obtained during the printing process. The proof must be a consistent duplicate of the desired half tone or line image. Visual examination of a color proof should reveal the color rendition to be expected from a press using the color separations, and any defects on the separations which might need to be altered before making the printing plates. Color proofing sheets for multicolored printing can be made by using a printing press or proof press. This requires that all of the actual printing steps be performed. However, this conventional method of color proofing is costly and time consuming. Alternate color proofing methods have therefore been developed to simulate the quality of press proofs. There are two general types of photoimaging methods, namely the overlay type and the single sheet type In the overlay color proofing method, an independent transparent plastic support is used for producing a colored image of each color separation film. A number of such supports carrying the various colored images of cyan, yellow, magenta and black are then superimposed upon each other and placed on a white sheet to produce a color proof. Examples of this approach are described in U.S. Pat. Nos. 3,136,637; 3,211,553; and 3,326,682. The primary advantage of this method is that it is quick and can serve as a progressive roof by combining any two or more colors in register. However, this color proofing method has the disadvantage that the superimposed plastic supports tend to darken the color proofing sheet, and, as a result, the impression of the color proofing sheet thus prepared becomes vastly different from copies actually obtained by conventional printing.

In the single sheet color proofing method, a color proofing sheet is prepared by successively producing images of the colors from different color separation films onto a single receiver sheet. This is done by using a single opaque support and by applying toners, photosensitive solutions, or coatings of photosensitive materials of corresponding colors to the opaque support in succession. Examples of this approach are described in U.S. Pat. Nos. 3,671,236; 4,260,673; 4,366,223; 4,650,738; 4,656,114; and 4,659,642. An advantage of the single sheet type of color proof is that the color is not influenced by superimposed plastic supports. This method more closely resembles actual printing and eliminates the color distortion inherent in the overlay system.

Various processes for producing copies of an image embodying photopolymerization and thermal transfer techniques are known as shown in U.S. Pat. Nos. 3,060,023; 3,060,024; 3,060,025; 3,481,736; and 3,607,264. In these processes, a photopolymerizable layer coated on a suitable support is imagewise exposed through a color separation. The surface of the exposed layer is then pressed into contact with the image receptive surface of a separate element and at least one of the elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. No. 3,721,557, a method of transferring colored images is described which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor for each subsequent transfer. U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium. The present invention improves upon the aforesaid system whereby the image is produced by a peel apart development process thus eliminating the need for a wet development.

Peel apart color proofing systems are themselves also known as such. In prior peel apart methods such as described in U.S. Pat. No. 4,489,154, a photosensitive layer is disposed between two self supporting sheets which are typically polyester. Upon exposure, there is an imagewise differential in adhesion of the exposed and unexposed portions of the photosensitive image to one of the two sheets forming the photosensitive element. This differential is critical to the functioning of the system. Therefore, it is necessary to control the adhesive forces between the sheets and the photosensitive layers. Hence, the sheet materials on which the image is produced has been limited to those specially produced by the manufacturer of the color proofing film. This means that images can usually only be produced on special substrates provided by the manufacturer. However, in use, the printer typically wishes to see the proof on the very particular paper stock on which he eventually will print. This has not been possible with prior peel apart development methods since variant paper stocks usually do not have the surface integrity demanded by peel apart systems. The present invention improves upon this situation by modifying a desired paper stock so that it may have the necessary surface characteristics to build a peel apart image proof directly on its surface.

SUMMARY OF THE INVENTION

The present invention provides a positive-working, peel developable, single sheet color proofing method which comprises, in order:

A. providing a receiver sheet; and
B. providing a substrate having a release surface and a first adhesive layer on said release surface, which first adhesive layer comprises a thermoplastic resin or resins and has a peel strength of greater than 100 g/inch when adhered to said receiver sheet; and C. laminating said substrate to the receiver sheet with pressure at a temperature in the range of from about 60° C. to about 180° C. with the first adhesive layer therebetween; and D. peeling apart said substrate and receiver sheet, thereby transferring the first adhesive layer to the receiver sheet; and E. providing a photosensitive article which comprises a transparent support and preferably a single photosensitive composition layer on said support, said photosensitive composition comprising an organic binding resin, a colorant, a photoinitiator, and a free radical polymerizable acrylate or methacrylate component having at least two ethylenically unsaturated groups; wherein said binding resin is present in sufficient amount to bind the composition components into a uniform film; wherein said colorant is present in sufficient amount to uniformly color the composition; wherein the photoinitiator is present in sufficient amount to initiate the free radical polymerization of said polymerizable component upon exposure to sufficient actinic radiation; and wherein said polymerizable component is present in sufficient amount to provide an image differentiation when the composition is exposed to actinic radiation; and a second adhesive layer directly adhered to said photosensitive composition layer, which second adhesive layer comprises a thermoplastic resin or resins and is transferable at a temperature in the range of from about 60° C. to about 120° C.; and in either order (F) or (G);

F. laminating the second adhesive layer on the photosensitive composition layer to the first adhesive layer on the receiver sheet; and G. imagewise exposing said photosensitive composition layer to sufficient actinic radiation to provide an image differentiation; and H. peeling apart the support and the receiver sheet such that the second adhesive layer and the imagewise nonexposed portions of the photosensitive composition are transferred to the first adhesive layer on the receiver sheet while the imagewise exposed portions remain on the support; and I. optionally repeating steps E through H at least once with another photosensitive article having a different colorant, and the imagewise nonexposed, peel developed portions thereof along with its second adhesive layer from the photosensitive article are formed in a like manner directly on the preceding imagewise nonexposed, peel developed portions on said receiver sheet.

DETAILED DESCRIPTION OF THE PREFERRED EMBODIMENT

In the usual full color proof, four distinct colored images are formed, namely cyan, yellow, magenta, and black. When the images are superimposed upon each other, a simulated full color reproduction results. As hereinbefore described, one begins the process of the present invention by preparing a receiver sheet with an adhesive and sequentially laminating, exposing and peel developing a colored, photopolymerizable article on top of the receiver sheet.

The receiver sheet may comprise virtually any material which can withstand the laminating and dry development processes. It should be dimensionally stable. White plastic sheets, such as adhesion pretreated polyester Melinex 3020 from ICI, are useful for this purpose. Plastic coated paper sheets, such as polyethylene coated paper from Schoeller, may also be used. Other bases may include wood, glass, metal, and the like. Preferably, the receiver sheet is normal printing paper, such as Mead 25 (70) and Champion Kromekote IS. Generally, the second adhesive layer in the photosensitive article does not adhere well to paper due to the high softening temperature of this adhesive layer. This high temperature adhesive is necessary to prevent migration of the monomer from the photosensitive composition layer into it during normal storage. Therefore, the surface of the receive sheet is prepared for better adhesion by applying a tackier first adhesive layer to it.

The first adhesive layer comprises a thermoplastic resin or resins. These resins have preferably a glass transition temperature in the range from about −20° C. to about 25° C. Copolymers containing vinyl acetate groups are preferred as the thermoplastic resin. In particular, vinyl acetate/ethylene copolymers with a vinyl acetate mole percentage in the range between 15% and 90% are useful as thermoplastic resins in the first adhesive layer. Examples of such resins nonexclusively include Airflex 465 DEV available from Air Products, and Elvax 150-W available from DuPont. Also, vinyl acetate/acrylate copolymers, such as Mowilith DM6, can be employed as the thermoplastic resins.

The first adhesive layer may optionally contain other desired components like uv absorbers such as Uvinul D-50 available from GAF; plasticizers such as Resoflex R-296 available from Cambridge Industries; antistatic compounds such as Gafstat available from GAF; and inert fillers such as Nitrocellulose RS ½ available from Hercules.

The components of the first adhesive layer can be dispersed in water or dissolved in a suitable solvent or solvent mixture. The aqueous based dispersions are generally diluted with water.

Suitable organic solvents nonexclusively include acetone, methanol, diacetone alcohol, amyl acetate, n-butyl acetate, ethyl acetate, methylene chloride, chloroform, toluene, and benzene. The first adhesive solution is usually coated onto the release surface of a substrate. It is then dried to a coating weight of from about 2 to about 40 g/m$^2$, or more preferably from about 5 to about 20 g/m$^2$. Alternatively, the components for the first adhesive layer may be hot melt extruded onto the release surface.

The substrate for the first adhesive layer comprises a sheet material which is dimensionally stable under the laminating conditions and chemically stable under the adhesive application conditions. These nonexclusively include polyesters, particularly polyethylene terephthalate. The substrates may be transparent or opaque, clear or colored. In the usual case, it has a thickness of from about 0.002 cm to about 0.025 cm, a more preferred thickness is from about 0.005 cm to about 0.013 cm, and most preferably from about 0.005 cm to about 0.008 cm. Suitable films nonexclusively include Hostaphan 3000 available from Hoechst Celanese, Mylar D available from DuPont, and Melinex 516 available from ICI. The surface of the substrate may be smooth or may be provided with a matte texture by various methods known in the art. Examples of matte films include Melinex 377 and 470 available from ICI. The substrate must have a release surface, that is, it must be capable of releasably holding the first adhesive layer thereto. This may be accomplished by either the substrate surface being inherently releasable, being rendered releasable by a suitable treatment, or being provided with a release layer over the substrate surface. Such a release layer may comprise polyvinyl alcohol or poly(dimethylsiloxane).

The first adhesive layer is transferred to the receiver sheet by laminating the substrate to the receiver sheet with the first adhesive layer between the sheet and substrate. Lamination may be conducted by putting the relevant layers in contact and then introducing the two materials into the nip of a pair of heated laminating rollers under suitable pressure. Suitable laminating temperatures usually range from about 60° C. to about 120° C., or preferably from about 70° C. to about 100° C. After lamination, the substrate and receiver sheet are peeled apart at room temperature, thereby transferring the first adhesive layer from the substrate to the receiver sheet. The adhesive layer adheres to the receiver sheet with a peel strength of greater than 100 g/in, preferably greater than 200 g/in, and most preferably greater than 500 g/in, as measured at a peel speed of 10 in/min and peel angle of 160°.

The first adhesive layer may optionally consist of two distinguishable layers: an in-between adhesive layer and the receiver adhesive layer. The in-between adhesive layer is initially between the substrate and the receiver adhesive layer, and is finally between the receiver adhesive layer and the second adhesive layer, which is described below. The in-between adhesive layer comprises a thermoplastic resin or mixture thereof. These resins have preferably a glass transition temperature in the range from about 25° C. to about 70° C. Vinyl acetate polymers and copolymers are preferred. The layer may have other desired components. It has a dry coating weight of from about 2 to about 40 g/m$^2$, or more preferably from about 5 to about 20 g/m$^2$. The receiver adhesive layer is, after transfer, between the receiver sheet and the in-between adhesive layer. The main reason for this layer is to strongly bond the photosensitive article to the receiver sheet. Therefore, the receiver adhesive layer has the same characteristics as the first adhesive layer as described above. In particular, the first adhesive layer comprises a thermoplastic resin or resins with lower glass transition temperatures of from about −20° C. to about 25° C. The receiver adhesive layer is generally coated on top of the in-between adhesive layer. Solvents for the receiver adhesive layer must be selected for the proper bonding between the first adhesive layer and the in-between adhesive layer.

The photosensitive article has a support and sequentially carried thereon a colored, photopolymerizable layer and then a second adhesive layer. The support may be composed of any suitable flexible sheet material provided it is transparent to the actinic radiation for the photopolymerizable layer. It should also preferably be dimensionally and chemically stable when treated with the herein specified processes. In particular, it should have substantially no change in dimensions during lamination. One preferred material is polyethylene terephthalate. In the usual case, it has a thickness of approximately 0.002 to 0.020 cm and a more preferred thickness of approximately 0.005 to 0.008 cm. Suitable films nonexclusively include Melinex 054, 504, 505, and 582 available from ICI, and Hostaphan 4400, 4500, and 4540 available from Hoechst Celanese. The films may be adhesion pretreated on one side or on both sides. Examples of adhesion pretreatment subbing layers are disclosed in U.S. Pat. No. 2,627,088. The surface of the support may be smooth or it may be provided with a matte texture as with Melinex 475. A smooth surface is preferred because a rough surface scatters the actinic radiation and thereby reduces the resolution capability of the photosensitive element.

The colored, photosensitive layer is applied from a solvent coating composition to the support, preferably to the adhesion pretreated side of the support. Organic solvents are preferred for the photosensitive coating because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, and gamma-butyrolactone.

A typical photosensitive layer comprises a photopolymerizable monomer, photoinitiator, colorant, binder, and optional ingredients.

The photopolymerizable material contained in the colored, photosensitive layer preferably comprises an addition polymerizable, nongaseous (boiling temperature above 100° C. at normal atmospheric pressure), ethylenically-unsaturated compounds containing at least two terminal ethylenically-unsaturated groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

Free radical liberating photoinitiators include any compound which liberates free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. Nos. 2,448,828; the triarylimidazolyl dimers in U.S. Pat. No. 3,479,185; the alpha-hydrocarbon-unsubstituted hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and Printex 25. Most of these pigments are products of Hoechst AG. They can be used separately or blended for a desired color.

The photosensitive layer also contains a binder which not only determines the hardness and/or flexibility of the coating but is also used to control the dry development. For example, the colored layer will remain with its support in the exposed and nonexposed areas if too much of the binder is present. If too little is present, then the colored layer will be totally transferred with the second adhesive layer.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and the like. The preferred binders are polyvinyl acetals, such as polyvinyl butyral and polyvinyl propional. The most preferred binders are polyvinyl formals which are commercially available from Monsanto as Formvar. The formal content of the polyvinyl formals is approximately 65 to 86 % expressed as % polyvinyl formal. The acetate content is approximately 9 to 30 % expressed as % polyvinyl acetate. The hydroxyl content is approximately 5 to 7 % as expressed as % polyvinyl alcohol. The average molecular weight is between 10,000 and 40,000.

Dyes may be included to spectrally sensitize the photoinitiator, such as described in U.S. Pat. Nos. 4,282,309 and 4,454,218, and European Patent Application Nos. 0,179,448 and 0,211,615.

Other ingredients which may be present in the photosensitive layer are thermal polymerization inhibitors, plasticizers, oligomers, residual solvents, surfactants, inert fillers, antihalation agents, hydrogen atom donors, photoactivators, and optical brightening agents.

In the preferred embodiment, the dry photosensitive layer has a coating weight range between approximately 0.1 and 5 g/m$^2$. The more preferred coating weight is between approximately 0.4 and 2 g/m$^2$.

In the practice of the present invention, the photopolymerizable monomer component is preferably present in the photosensitize layer in an amount ranging from approximately 10 to 60% based on the weight of the solids in the layer. A more preferred range is from approximately 15 to 40%.

In the practice of the present invention, the photoinitiator component is preferably present in the photosensitive layer in an amount ranging from approximately 2 to 30% based on the weight of the solids in the layer. A more preferred range is from approximately 6 to 20%.

In the practice of the present invention, the colorant component is preferably present in the photosensitive layer in an amount ranging from approximately 10 to 50% based on the weight of the solids in the layer. A more preferred range is from approximately 15 to 35%.

In the practice of the present invention, the binder component is preferably present in the photosensitive layer in an amount ranging from approximately 10 to 75% based on the weight of the solids in the layer. A more preferred range is from approximately 20 to 50%.

The second adhesive layer is next applied to the photosensitive layer. Its purpose is to aid in the transfer of the coating composite and to protect the integrity of underlying, previous formed images during dry development of subsequent layer(s). The application of the second adhesive may be accomplished in several different ways. For example, some adhesives may be coated on top of the photosensitive layer out of organic solvents which do not have any solubilizing or deleterious effect on the photosensitive layer. Such solvents include cyclohexane, n-heptane, and n-hexane. Other adhesives may be coated out of water mixtures. Acrylic copolymers with high acid numbers, such as Carboset 525 from B. F. Goodrich, can be coated out of ammonium hydroxide:water mixtures. Alternatively, some adhesives may be coated as aqueous emulsions. Examples of aqueous emulsions include polyvinyl acetate dispersions such as Gelva TS 100 available from Monsanto. Some adhesives may be applied by hot melt extrusion. Suitable adhesives for this method of application include the ethylene/vinyl acetate copolymers, such as Elvax 210 available from DuPont.

The preferred method for applying the second adhesive to the photosensitive layer is by laminating the two together under elevated pressure and/or temperature. The adhesive is initially coated onto a release surface of a temporary support. The dried second adhesive layer is then transferred directly to the photosensitive layer with removal of the temporary support.

Acrylic polymers and copolymers are preferred for the lamination method for applying the second adhesive to the photosensitive layer. Polyvinyl acetate polymers and copolymers are more preferred for this lamination method. Polyvinyl acetates are available from Hoechst AG as Mowilith. These resins have a average molecular weight between 35,000 and 2,000,000. They have a softening temperature between 80° and 180° C. In the preferred embodiment, the polyvinyl acetate is present in the second adhesive layer in an amount of greater than approximately 50 percent by weight. The thermoplastic resin or resins in the second adhesive layer should have a softening temperature in the range of approximately 40° to 200° C., more preferably 60° to 120° C. Their glass transition temperatures are generally in the range of from about 25° C. to about 80° C., which is higher than those of the resins used in the first adhesive layer. The layer may optionally contain such other desired components as uv absorbers, antistatic compositions, optical brighteners, and plasticizers. Suitable plasticizers include phthalates, nonexclusively including dibutyl phthalate, butyl benzyl phthalate, and dimethyl phthalate. Polymeric plasticizers, such as Resoflex R-296 available from Cambridge Industries, may also be used. The plasticizer may be present in the adhesive layer in an amount of up to approximately 30 percent by weight.

In the preferred embodiment, the dry second adhesive layer has a coating weight range between approximately 2 and 30 g/m$^2$. The more preferred coating weight is between approximately 4 and 15 g/m$^2$. The thickness of the adhesive layers may be adjusted to regulate the apparent dot size of the final proof.

The photosensitive layer is exposed by means well known in the art either before or after the second adhesive layer is directly laminated to the first adhesive layer on the receiver sheet. Exposure is preferably after the second adhesive layer is applied. Such exposure may be conducted by exposure to actinic radiation from a light source through a conventional halftone positive color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After lamination of the second adhesive layer with the photosensitive layer and its support to the first adhesive layer on the receiver sheet and after exposure of the photosensitive layer, the photosensitive layer is dry developed by stripping the support from the receiver sheet at room temperature with a steady, continuous motion. No devices are necessary to hold down the receiver sheet during stripping because only moderate manual peeling forces are needed to separate the materials. The peel strengths are generally between 5 and 100 g/in which are lower than the peel strengths between the receiver sheet and the first adhesive layer. The preferred peel angle relative to the peel direction is greater than 90°. The delamination leaves the photoexposed areas on the support and the nonexposed areas on the second adhesive layer. The first and second adhesive layers remain with the receiver sheet. Thus, a positive image with the adhesive layers remains on the receiver sheet.

Another photosensitive layer is laminated via a second type of adhesive layer to the first image on the receiver sheet. The second photosensitive layer has preferably a different color than the first and is exposed through the appropriate color separation. After lamination to the previous image and exposure, the support of the second photosensitive layer is removed as was done with the first support. The second positive image with its second adhesive remains with the first image. A third and a fourth image may be added in a manner similar to that used to produce the second image. In the usual case, four colored layers are employed to produce a full color reproduction of a desired image.

A matte finish of the final image may be obtained by embossing the shiny, top surface of the image with a matte material, such as Melinex 377 from ICI. This is done by laminating together the final image and matte material. The matte material is then generally removed after lamination. The advantage of this method is that the finish of the final proof can be determined by careful selection of the matting material.

The final four color proof may be given a uniform, blanket exposure to photoharden the nonexposed, colored areas on the receiver sheet. A protective layer may also be laminated on top of the last dry developed layer.

The following nonlimiting examples serve to illustrate the invention.

EXAMPLE 1

The receiver is a sheet of coated paper commercially available as Champion Kromekote IS. The formulation for the first adhesive solution contains the following ingredients in parts by weight, as indicated.

| | |
|---|---|
| toluene | 90 |
| Elvax 150-W | 10 |

The ingredients are thoroughly mixed and coated onto a 0.0067 cm thick Melinex 516 substrate to a dry coating weight of 17 g/m². The substrate and the receiver sheet are then laminated with the adhesive layer in between through a set of pressure rollers having a temperature of 75°C. and a speed of 56 cm/min. The substrate is peeled off, leaving the first adhesive layer on the paper receiver sheet. The peel strength of the first adhesive layer relative to the paper is 150 g/in.

The formulations for the photosensitive layers include the following ingredients in parts by weight, as indicated.

| | Cyan | Yellow | Magenta | Black |
|---|---|---|---|---|
| Tetrahydrofuran | 200 | 200 | 200 | 200 |
| 4-Hydroxy-4-methyl-2-pentanone | 150 | 150 | 150 | 150 |
| 1-Methoxy-2-propanol | 444 | 465 | 489 | 490 |
| gamma-Butyrolactone | 44 | 65 | 89 | 90 |
| Formvar 12/85 | 6 | 13 | 18 | 9 |
| Di-pentaerthritol monohydroxy pentaacrylate | 8 | 12 | 8 | 12 |
| 2,3-Di(4-methoxyphenyl) quinoxaline | 4 | 4 | 4 | 4 |
| Hostaperm Blue B2G | 7 | — | — | — |
| Permanent Yellow GR | — | 7 | — | — |
| Permanent Red FBB | — | — | 12 | — |
| Printex 25 | — | — | — | 11 |

The pigments are introduced into the above solutions as dispersions. They are dispersed in some of the binder and solvents, and are ground to the proper particle size for the correct transparency. The median diameter is less than 0.2 micrometers. The ingredients are thoroughly mixed and the solutions are coated onto the adhesion pretreated side of four 0.0063 cm thick Melinex 528 supports, which are transparent polyethylene terephthalate films with an antistat pretreatment on the opposite side. This film base is commercially available from ICI. The coatings are dried at 93° C. to give optical densities of 1.3, 0.9, 1.3, and 1.6 for cyan, yellow, magenta, and black, respectively.

The formulation for the second adhesive layer include the following ingredients in parts by weight, as indicated.

| | |
|---|---|
| n-Butyl acetate | 85 |
| Mowilith 60 | 15 |

The second adhesive ingredients are thoroughly mixed and coated onto four 0.0076 cm thick silicone treated Melinex 442 temporary supports available from Custom Coating and Laminating. The film base itself, i.e. Melinex 442, is a polyethylene terephthalate film available from ICI. The coating is dried at 93° C. to a coating weight of 4 g/m².

The second adhesive layers are applied directly to the photosensitive layers by laminating together the photosensitive supports and temporary supports with the photosensitive layers in direct contact with the second adhesive layers. The temporary support is removed, transferring the second adhesive layer to the photosensitive layer. Next, the cyan photosensitive article is laminated via the second adhesive layer to the first adhesive layer on the receiver sheet. The transferred composite is then image-wise exposed to actinic light through a cyan positive color separation and through the support. After the exposure, the support is removed from the receiver sheet, thereby removing the imagewise exposed portions with the support while leaving the adhesive layers and the imagewise nonexposed portions of the cyan photosensitive layer on the paper receiver sheet.

The magenta photosensitive article comprises a support, photosensitive layer, and second adhesive layer is laminated to the first, cyan image via the second adhesive layer of the magenta article. The laminated article is then imagewise exposed for an exposure duration equal to that for the cyan photosensitive layer. After the exposure, the support is removed, revealing the magenta image on top of the cyan image. This method is repeated for the yellow photosensitive layer and then for the black photosensitive layer. A full, four color reproduction is produced which gives an accurate representation of the original from which the separations are prepared. The resolving power for equal lines and spaces using these photosensitive layers is 15 micrometers. The dot reproduction range is 2 to 98% with a 60 line/cm screen. The average dot gain for the four colors is relatively low at 14%. If the second adhesive layer is thicker at 12 g/m² instead of 4 g/m², then the average dot gain is increased to 19%.

EXAMPLE 2

The receiver is a sheet of noncoated paper commercially available as Mead 2S (70). The formulation for the first adhesive solution contains the following ingredients in parts by weight, as indicated.

| Water | 50 |
|---|---|
| Mowilith DM6 | 50 |

The ingredients are thoroughly mixed and coated onto a 0.0067 cm thick Melinex 516 substrate to a dry coating weight of 12 g/m². The first adhesive layer is transferred from the substrate to the receiver sheet by laminating and peeling as shown in Example 1. The peel strength is approximately 450 g/in.

The formulations for the photosensitive layers are the same as used in Example 1. However in this case, the solutions for the photosensitive layers are coated as before onto four 0.0075 cm thick Melinex 505 supports. This type of support is a transparent polyethylene terephthalate film available from ICI with adhesion surface pretreatment on both sides.

The formulation for the second adhesive layer include the following ingredients in parts by weight, as indicated.

| n-Butyl acetate | 78 |
|---|---|
| Resoflex R-296 | 1 |
| Mowilith 30 | 21 |

The solution for the second adhesive layer is coated to a dry coating weight of 12 g/m² onto four 0.0075 cm thick Melinex 516 temporary supports. This type of temporary support is a transparent polyethylene terephthalate film from ICI with a slip surface pretreatment.

The second adhesive layers are transferred from the temporary support to the photosensitive layer as shown in Example 1. The cyan photosensitive article is laminated via the second adhesive layer to the first adhesive layer on the receiver sheet. The photosensitive layer is then image-wise exposed to actinic light through a cyan positive color separation and through the support. The cyan photosensitive layer is subsequently dry developed by the removal of the support from the receiver sheet.

The magenta photosensitive article is laminated to the cyan image. After lamination, the magenta photosensitive layer is imagewise exposed at room temperature. The magenta image is formed by peel development like the cyan image. This is repeated for the yellow photosensitive article and then for the black photosensitive article. A 0.0075 cm thick Melinex 377 matte temporary support is coated with a protective layer formulation as given below to a dry coating weight of 4 g/m².

| Methyl cellosolve | 90 |
|---|---|
| Butvar B-79 | 10 | resins are available from Monsanto. The protective layer with its temporary support is laminated to the four color proof, with subsequent removal of the temporary support. A four color proof with a protective matte finish is produced, which is an accurate representation of the original from which the separations are prepared.

EXAMPLE 3

The receiver is a sheet of coated paper commercially available receiver as Champion Kromekote 1S. The formulation for an in-between adhesive layer between the substrate and receiver adhesive layer contains the following ingredients in parts by weight, as indicated.

| Methyl ethyl ketone | 58 |
|---|---|
| gamma-a-Butyrolactone | 20 |
| Resoflex R-296 | 1 |
| Mowilith 30 | 21 |

This solution is coated onto a 0.0067 cm thick Melinex 516 substrate to a dry coating weight of 4 g/m². This in-between adhesive layer on the substrate is overcoated with a receiver adhesive solution containing the following ingredients to a dry coating weight of 12 g/m².

| Water | 50 |
|---|---|
| Airflex 465 DEV | 50 |

The substrate and the receiver sheet are then laminated with the two adhesive layers in between. The substrate is then removed, resulting in the two adhesive layers, which represent the first adhesive layer, being transferred to the receiver sheet.

The formulations for the photosensitive layer are the same as in Example 1 and are coated onto four 0.0075 cm thick Melinex 505 supports. The formulation for the second adhesive is the same as in Example 2 and coated onto four 0.0075 cm thick silicone treated Melinex 442 to a dry coating weight of 12 g/m². The second adhesive layers are then transferred from the temporary supports to the photosensitive layers. Next, the cyan photosensitive article is laminated, exposed, and peel developed on the in-between adhesive layer which adheres to the receiver adhesive layer on the receiver sheet. The in-between adhesive layer gives a better release when the substrate is removed from the receiver sheet, and it improves the adhesion between the first and second adhesive layers.

The magenta photosensitive article is laminated to the cyan image. It is then exposed and peel developed. This is repeated for the yellow photosensitive article and then for the black photosensitive article to produce a full color, glossy color proof.

What is claimed is:

1. A positive-working, peel developable, single sheet color proofing method which comprises, in order:
   A. providing a receiver sheet; and
   B. providing a substrate having a release surface and a first adhesive layer on said release surface, which first adhesive layer comprises a thermoplastic resin or resins and has a peel strength of greater than 100 g/inch when adhered to said receiver sheet; and C. laminating said substrate to the receiver sheet with pressure at a temperature in the range of from about 60° C. to about 180° C. with the first adhesive layer therebetween; and D. peeling apart said substrate and receiver sheet, thereby transferring the first adhesive layer to the receiver sheet; and E. providing a photosensitive article which comprises a transparent support and a photosensitive composition layer on said support, said photosensitive composition comprising an organic binding resin, a colorant, a photoinitiator, and a free radical polymerizable acrylate or methacrylate component having at least two ethylenically unsaturated groups; wherein said binding resin is present in sufficient amount to bind the composition components into a uniform film; wherein said colorant is present in sufficient amount to uniformly color the composition; wherein the photoinitiator is present in sufficient amount to initiate the free radical polymerization of said polymerizable component upon exposure to sufficient actinic radiation; and wherein said polymerizable component is present in sufficient amount to provide an image differentiation when the composition is exposed to actinic radiation; and a second adhesive layer directly adhered to said photosensitive composition layer, which second adhesive layer comprises a thermoplastic resin or resins and is transferable at a temperature in the range of from about 60° C. to about 120° C.; and in either order (F) or (G);

F. laminating the second adhesive layer on the photosensitive composition layer to the first adhesive layer on the receiver sheet; and G. imagewise exposing said photosensitive composition layer to sufficient actinic radiation to provide an image differentiation; and H. peeling apart the support and the receiver sheet such that the second adhesive layer and the imagewise nonexposed portions of the photosensitive composition are transferred to the first adhesive layer on the receiver sheet while the imagewise exposed portions remain on the support.

2. The method of claim 1 further comprising the subsequent step of repeating steps E through H at least once with another photosensitive article having a different colorant, and the imagewise nonexposed, peel developed portions thereof along with its second adhesive layer from the photosensitive article are formed in a like manner directly on the preceding imagewise nonexposed, peel developed portions on said receiver sheet.

3. The method of claim 1 wherein said photosensitive composition comprises one or more binding resins selected from the group consisting of styrene/maleic anhydride copolymers and their half esters; acrylic polymers and copolymers; polyamides; polyvinyl pyrrolidones; cellulosic resins; phenolic resins; and polyvinyl acetals.

4. The method of claim 1 wherein said photosensitive composition comprises one or more colorants selected from the group consisting of dyes and pigments.

5. The method of claim 1 wherein said photosensitive composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerthyritol tetraacrylate, trimethylol propane triacrylate, trimethylol propane trimethacrylate, di-pentaerthyritol monohydroxypentaacrylate, pentaerthritol triacrylate, bisphenol A ethoxylate dimethacrylate, trimethylolpropane ethoxylate triacrylate, and trimethylolpropane propoxylate triacrylate.

6. The method of claim 1 wherein said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives.

7. The method of claim 1 wherein said photosensitive composition layer further comprises one or more ingredients selected from the group consisting of spectral sensitizers, thermal polymerization inhibitors, plasticizers, oligomers, surfactants, inert fillers, antihalation agents, hydrogen atom donors, photoactivators, and optical brightening agents.

8. The method of claim 1 wherein said support and substrate comprises polyethylene terephthalate.

9. The method of claim 1 wherein said receiver sheet comprises paper.

10. The method of claim 1 wherein said first adhesive layer comprises a resin or resins with glass transition temperatures of from about $-20°$ C. to about 25° C.

11. The method of claim 1 wherein said first adhesive layer comprises a copolymer containing vinyl acetate groups.

12. The method of claim 1 wherein said second adhesive layer comprises a resin or resins with glass transition temperatures of from about $-25°$ C. to about 80° C.

13. The method of claim 1 wherein said second adhesive layers comprise a vinyl acetate polymer or copolymer containing vinyl acetate groups.

14. The method of claim 1 wherein said receiver base comprises paper, coated paper, or a polymeric film.

15. The method of claim 1 wherein said lamination is conducted at a temperature of from about 60° C. to about 120° C.

16. The method of claim 1 wherein said first adhesive layer comprises two adhesive layers.

17. The method of claim 16 wherein said first adhesive layer comprises two adhesive layers, an in-between adhesive layer and a receiver adhesive layer, such that the in-between adhesive layer is disposed between the substrate and the receiver adhesive layer, wherein the in-between adhesive layer comprises one or more thermoplastic resins having a glass transition temperature in the range from about 25° C. to about 70° C. and the receiver adhesive layer comprises one or more thermoplastic resins with glass transition temperatures of from about $-20°$ C. to about 25° C.

18. The method of claim 17 wherein the in-between adhesive layer comprises a vinyl acetate polymers or copolymer containing vinyl acetate groups and has a dry coating weight of from about 2 to about 40 $g/m^2$.

19. The method of claim 17 wherein the receiver adhesive layer comprises a copolymer containing vinyl acetate groups.

20. The method of claim 1 wherein said support and substrate comprise polyethylene terephthalate; and said photosensitive composition comprises one or more acrylate or methacrylate components selected from the group consisting of triethylene glycol dimethacrylate, tripropylene glycol diacrylate, tetraethylene glycol dimethacrylate, diethylene glycol dimethacrylate, 1,4- butanediol diacrylate, 1,6-hexanediol dimethacrylate, pentaerythritol tetraacrylate, trimethylol propane triacrylate, trimethylol propane trimethacrylate, dipentaerthyritol monohydroxypentaacrylate, pentaerthritol triacrylate, bisphenol A ethoxylate dimethacrylate, trimethylolpropane ethoxylate triacrylate, and trimethylolpropane propoxylate triacrylate; and said photosensitive composition comprises a binding resin selected from the group consisting of vinyl acetals polymers or copolymers containing vinyl acetal groups; and said photosensitive composition comprises one or more photoinitiators selected from the group consisting of 2,3-di(4methoxyphenyl)quinoxaline, 9-phenylacridine, bis(2,4,5triphenyl)imidazole, and their derivatives; and said photosensitive composition comprises one or more pigments; said first adhesive layer comprises a copolymer containing vinyl acetate groups; said second adhesive layer comprises a vinyl acetate polymer; and said receiver sheet comprises paper.

* * * * *